(12) United States Patent
Kusano et al.

(10) Patent No.: US 7,776,507 B2
(45) Date of Patent: Aug. 17, 2010

(54) PHOTOSENSITIVE PASTE AND MANUFACTURING METHOD OF MEMBER FOR DISPLAY PANEL

(75) Inventors: Kazutaka Kusano, Shiga (JP); Yuko Fujiwara, Shiga (JP); Yuichiro Iguchi, Shiga (JP)

(73) Assignee: Toray Industries, Inc., Tokyo (JP)

( * ) Notice: Subject to any disclaimer, the term of this patent is extended or adjusted under 35 U.S.C. 154(b) by 634 days.

(21) Appl. No.: 11/658,006

(22) PCT Filed: Jul. 14, 2005

(86) PCT No.: PCT/JP2005/012983

§ 371 (c)(1),
(2), (4) Date: Apr. 2, 2007

(87) PCT Pub. No.: WO2006/009051

PCT Pub. Date: Jan. 26, 2006

(65) Prior Publication Data

US 2009/0035452 A1 Feb. 5, 2009

(30) Foreign Application Priority Data

Jul. 22, 2004 (JP) ............................. 2004-214586

(51) Int. Cl.
*G03F 7/00* (2006.01)
*G03F 7/004* (2006.01)

(52) U.S. Cl. .................. 430/270.1; 430/290; 430/905; 430/926; 430/913; 430/330

(58) Field of Classification Search ............ 430/270.1, 430/330, 270.15, 281.1, 905, 290, 913, 926
See application file for complete search history.

(56) References Cited

U.S. PATENT DOCUMENTS

| | | | |
|---|---|---|---|
| 4,664,831 A * | 5/1987 | Hibst et al. ............... | 252/62.59 |
| 6,183,669 B1 | 2/2001 | Kubota et al. | |
| 6,262,513 B1 * | 7/2001 | Furukawa et al. ....... | 310/313 R |
| 6,628,043 B2 * | 9/2003 | Furukawa et al. ....... | 310/313 R |
| 6,835,680 B2 * | 12/2004 | Taguchi et al. ................ | 501/20 |
| 7,171,378 B2 * | 1/2007 | Petrovich et al. .............. | 705/26 |
| 7,381,353 B2 * | 6/2008 | Lee et al. ..................... | 252/511 |
| 7,462,304 B2 * | 12/2008 | Wang et al. .................. | 252/514 |
| 7,494,607 B2 * | 2/2009 | Wang et al. .................. | 252/514 |
| 2006/0130192 A1 * | 6/2006 | Lee et al. ..................... | 977/783 |
| 2007/0238036 A1 * | 10/2007 | Hayakawa et al. ............. | 430/15 |

FOREIGN PATENT DOCUMENTS

| | | | |
|---|---|---|---|
| EP | 1 239 717 A2 | | 9/2002 |
| JP | 03232136 A | * | 10/1991 |
| JP | 06-204022 | | 7/1994 |
| JP | 08-082922 | | 3/1996 |
| JP | 10182185 A | * | 7/1998 |
| JP | 2000-072535 | | 3/2000 |
| JP | 2000-275826 | | 6/2000 |
| JP | 2000-199956 | | 7/2000 |
| JP | 2002-268205 | | 9/2002 |
| JP | 2002-271086 | | 9/2002 |
| JP | 2002-287375 | | 10/2002 |
| JP | 2003-057829 | | 2/2003 |
| JP | 2004221453 A | * | 8/2004 |
| JP | 2006147621 A | * | 6/2006 |

OTHER PUBLICATIONS

Machine translation of JP 2004-221453 (no date).*
Machine translation of JP 10-181185; abstract, claims, and description (no date).*
Lee et al., "Synthesis of ZnFe2O4 nanosized powders from pulsed metallic zinc and iron wire dischsrge in oxygen", Journal of Magnetism and Magnetic Materials, 312 (2007) pp. 27-31.*
English abstract of JP 03-232136 (no date).*
Singh et al., "Effect of mixed ternary transition metal ferrite nanocystallites on thermal decompositoin of ammonium perchlorate", Thermochimica Acta 477(2007) pp. 42-47.*

* cited by examiner

*Primary Examiner*—Amanda C. Walke
(74) *Attorney, Agent, or Firm*—Pillsbury Winthrop; Shaw Pittman LLP

(57) ABSTRACT

A photosensitive paste is provided with which a member for a display panel having superior visibility can be manufactured with simple steps, and with the photosensitive paste including a soft magnetic powder, a glass powder, and a photosensitive organic component, in which the mass ratio of the soft magnetic powder (A) to the glass powder (B) is in the range of 20/80 to 70/30.

15 Claims, No Drawings

PHOTOSENSITIVE PASTE AND MANUFACTURING METHOD OF MEMBER FOR DISPLAY PANEL

REFERENCE TO RELATED APPLICATION

This application is a national stage application under 35 USC 371 of International Application No. PCT/JP2005/012983 which was filed on Jul. 14, 2005, which claims priority from Japanese Patent Application No. 2004-214586, filed on Jul. 22, 2004, the disclosures of which are incorporated herein by reference.

TECHNICAL FIELD

The present invention relates to a photosensitive paste including an inorganic powder with soft magnetic property.

BACKGROUND ART

An electromagnetic shielding material is broadly used for example as a front filter installed on a display to block electromagnetic waves leaking from the display. The electromagnetic shielding material used as a front plate is required not to decrease visibility of the display screen of a display besides the function of blocking the electromagnetic waves. For example, an electromagnetic shielding material comprising an etching sheet in which a metal foil is etched into a mesh-like form glued together with a transparent substrate is used as such an electromagnetic shielding material. However, there is a problem that many steps such as a laminating step of the metal foil and an etching step are necessary. Further, in order to improve visibility, a surface treatment step such as chrome plating to blacken the surface of the metal in mesh-like form becomes necessary, and there is a problem that a complex step is necessary. In Japanese Patent Application Laid-Open No. 2002-271086, a method of manufacturing an electromagnetic shielding material as a method to solve this problem by performing intaglio offset printing on a glass substrate of a geometric pattern using an ink including a black pigment and metal particles and then firing is provided. However, in the case that the black pigment is added at an amount at which sufficient blackness can be obtained, the resistance value of the conductive layer obtained becomes high because the black pigment has a high resistance value. Consequently, in order to maintain a sufficient electromagnetic shielding property, it is necessary to additionally form a metal layer on the surface of the black conductive layer with wet plating, and there is a problem that the step becomes complex.

Patent Document 1: Japanese Patent Application Laid-Open No. 2002-271086

DISCLOSURE OF THE INVENTION

Problem to be Solved by the Invention

The objective of the present invention is to provide a photosensitive paste with which a member for a display panel having sufficient visibility and electromagnetic shielding property can be manufactured with simple steps.

Means to Solve the Problem

The present invention is a photosensitive paste which is a paste comprising inorganic powder and a photosensitive organic component and in which the inorganic powder includes at least a soft magnetic powder (A) and a glass powder (B), and in which the mass ratio of the soft magnetic powder (A) to the glass powder (B) is in the range of 20/80 to 70/30.

Further, the present invention is a manufacturing method of a member for a display panel including the steps of applying the above-described photosensitive paste on the substrate and drying.

Effect of the Invention

According to the present invention, a photosensitive paste that is capable of forming a soft magnetic layer on which a pattern can be processed with high definition and having high magnetic permeability can be provided. By using the photosensitive paste in the present invention, a member for a display panel which is superior in visibility and in electromagnetic shielding property can be manufactured with simple steps.

BEST MODE FOR CARRYING OUT THE INVENTION

The photosensitive paste in the present invention is a photosensitive paste comprising an inorganic powder and a photosensitive organic component. The photosensitive paste in the present invention preferably includes 5 to 50% by mass in the paste of the photosensitive organic component and 50 to 95% by mass in the paste of the inorganic powder.

In the present invention, the inorganic powder includes at least a soft magnetic powder and a glass powder.

It is enough if the soft magnetic powder is a substance showing the characteristic of losing magnetic dipole density and returning to an original state when the external magnetic field is removed. Specific examples of the soft magnetic powder include a powder consisting of iron, iron alloys, or ferrite.

In the present invention, iron alloy powder or ferrite powder is preferable as the soft magnetic powder in the respect that such powder has high magnetic permeability and shows low electric conductivity. The ferrite powder is more preferable in the respect that the saturated density of magnetic flux is high and coercitivity is small. The ferrite powder consisting of ferrite shown in a formula of $MFe_2O_4$ (M is a divalent metal selected from Mn—Zn, Ni—Zn, Cu—Zn, Mg—Zn, and Ni—Cu—Zn) is especially preferable. Specific examples of the iron alloy powder include ones consisting of Permalloy, Supermalloy, permendur, amorphous, sendust, ferrite, Fe—Ni, Fe—Co, Fe—Zr, Fe—Mn, Fe—Si, or Fe—Al.

The average particle diameter of the soft magnetic powder is preferably in the range of 0.1 to 5 μm. A powder with an average particle diameter of less than 0.1 μm is difficult to disperse well into the photosensitive paste and is not preferable. A powder with an average particle diameter exceeding 5 μm is not preferable because the flatness of the film and the pattern shape after firing deteriorate. The average particle diameter is more preferably in the range of 0.5 to 4 μm. Furthermore, the maximum particle diameter of the soft magnetic powder is preferably 10 μm or less. When the maximum particle diameter of the soft magnetic powder exceeds 10 μm, it is not preferable because the flatness of the film and the pattern shape after firing deteriorate. The maximum particle diameter is more preferably 8 μm or less.

The average particle diameter and the maximum particle diameter can be obtained from a volume standard distribution of the Coulter Counter method, a photon correlation method, a laser diffractometry, etc.

The softening temperature of the glass powder is preferably 800° C. or less. Further, the softening temperature of the glass powder is preferably 350° C. or more. A glass with softening temperature of less than 350° C. has a low chemical stability. Further, when the softening temperature exceeds 800° C., the glass powder is rarely softened in the firing step.

In order to perform sufficient softening on the substrate also in the case that glass is used for the substrate, the softening temperature of the glass powder is more preferably 750° C. or less and further preferably 650° C. or less.

The glass powder preferably consists of noncrystalline glass. In the case of the crystalline glass, there is a case that cracks, etc. are easily generated on the film surface after the firing, and the insulating property and electric characteristics deteriorate. Further, considering a reaction with the soft magnetic powder, borosilicate glass including at least one kind of element selected from a group consisting of bismuth oxide, zinc oxide, lead oxide, and phosphorus oxide is preferably used. Further, considering the aspect of environment, glass powder having bismuth oxide and zinc oxide as a main component is preferable. Furthermore, in the case that glass powder including alkaline metal is used, because warpage of the substrate is generated due to an ion exchange reaction with the substrate glass at the firing, the content of the alkaline metal is preferably 10% by mass or less.

The average particle diameter of the glass powder is preferably in the range of 0.1 to 5 μm. A powder with an average particle diameter of less than 0.1 μm is difficult to disperse well into the photosensitive paste and is not preferable. A powder with an average particle diameter exceeding 5 μm is not preferable because the flatness of the film and the pattern shape after firing deteriorate. The average particle diameter is more preferably in the range of 0.5 to 4 μm. Furthermore, the maximum particle diameter of the glass powder is preferably 10 μm or less. When the maximum particle diameter of the glass powder exceeds 10 μm, it is not preferable because the flatness of the film and the pattern shape after firing deteriorate. The maximum particle diameter of the glass powder is more preferably 8 μm or less. The average particle diameter and the maximum particle diameter of the glass powder can be measured in the same manner as the soft magnetic powder.

Further, the particle diameter of the soft magnetic powder and the particle diameter of the glass powder are preferably nearly same size. Because the particle diameter of the soft magnetic powder and the particle diameter of the glass powder are preferably nearly same size, the generation of residual film at development can be suppressed and the obtained pattern shape can be stabilized. Specifically, the value of the average particle diameter of the soft magnetic powder/the average particle diameter of the glass powder are preferably in the range of 0.1 to 5 and more preferably 0.5 to 4. The same applies to the maximum particle diameter.

In the photosensitive paste in the present invention, it is necessary that the mass ratio of the soft magnetic powder (A) to the glass powder (B) is in the range of A/B=20/80 to 70/30. The glass powder is called a glass frit as well and is added at the firing to make the inorganic powder sinter easy. Because the glass frit is a component for binding, a small amount is preferable, and normally about 3 to 10% by mass is added in the inorganic powder. However, the inventors discovered that there is a case that the preferred result cannot be obtained when the amount of the glass powder (B) is less than 30% by mass to the total amount of the soft magnetic powder (A) and the glass powder (B) in the photosensitive paste in the present invention.

In order for the soft magnetic layer obtained by sintering the photosensitive paste to satisfy the electric characteristic such as a high magnetic permeability, it is necessary that the soft magnetic powder to be used has a high magnetic permeability, and also that a precise soft magnetic layer is formed by sintering sufficiently the soft magnetic powder and the glass powder. This is because the magnetic permeability that the soft magnetic powder originally has does not appear when the soft magnetic layer is not precise. In order to sinter the soft magnetic powder and the glass powder sufficiently, it is necessary to make the firing temperature relatively high. However, there is a case that the firing can not be performed at high temperature depending on the use. For example, in the case that glass is used for a substrate, the firing temperature is limited because firing at high temperature has a bad effect on the glass substrate. In the photosensitive paste in the present invention, by making the content of the glass powder (B) 30% by mass or more to the total amount of the soft magnetic powder (A) and the glass powder (B), it becomes possible to sinter the soft magnetic powder and the glass powder sufficiently at a relatively low firing temperature and the desired electric characteristic can be obtained. Further, when the content of the glass powder (B) exceeds 80% by mass to the total amount of the soft magnetic powder (A) and the glass powder (B), it is not preferable because the content of the soft magnetic powder (A) becomes too low and the electric characteristic of the soft magnetic layer thus deteriorates. The mass ratio is more preferably in the range of A/B=30/70 to 70/30, and more preferably in the range of A/B =40/60 to 70/30.

Further, inorganic powder besides the above-described soft magnetic powder and glass powder may be included in the photosensitive paste in the invention. For example, in the case of forming a black layer, adding a black pigment can contribute to the improvement of contrast when it is used as a front plate of the display. Pigments consisting of inorganic oxides including oxides of elements such as cobalt, nickel, copper, iron, manganese, chromium, and ruthenium can be preferably used as the black pigment. Although the oxides of each single element can be used, it is effective to use a spinel compound consisting of the oxides of three kinds or more elements. Especially, when the step of heating at 400 to 700° C. is experienced, color degradation at high temperature can be prevented by using a spinel compound including a Co element such as Co—Cr—Fe, Co—Mn—Fe, Co—Cu—Mn, Co—Ni—Mn, Co—Ni—Cr—Mn, and Co—Ni—Cu—Mn. It is preferable to use pigments having an average particle diameter of 0.01 to 1.5 μm as a black pigment because the black layer with uniform and sufficient blackness can be formed. When the average particle diameter of the black pigment becomes less than 0.01 μm, aggregation of the black pigment easily occurs and the blackness easily becomes non-uniform. Further, when the average particle diameter of the black pigment exceeds 1.5 μm, the blackness easily decreases. Further, carbon is also preferably used as the black pigment. By using a carbon particle with an average particle diameter of 1 μm or less, a black layer which is superior in blackness can be formed. When the heating step of 400° C. or more is experienced, heat resistant carbon is preferably used. The added amount of the black pigment depends on the type of the black pigment. However, the range of 0.1 to 10% by mass to the total amount of the inorganic powder is preferable in order to obtain sufficient blackness.

The photosensitive organic component in the photosensitive paste consists of at least one kind selected from a reactive monomer, a reactive oligomer, and a reactive polymer, and as occasion demands, an additive component such as a binder polymer, a photo-polymerization initiator, a photooxide generator, a photobase generator, a sensitizer, a sensitizing auxiliary, an ultraviolet ray absorber, an organic dye, a dispersing agent, a plasticizer, a thickener, an organic solvent, an acid, a base, a precipitation preventive agent, and a polymerization inhibitor. Here, the reactivity in the reactive monomer, the reactive oligomer, and the reactive polymer means to have a characteristic of changing the chemical structure through the reaction such as photo-cross-linking, photo-polymerization, photo-depolymerization, and photo-deformation when an irradiation of active light beam is received.

A compound having active carbon-carbon unsaturated double bonds is preferably used as the photosensitive monomer. A single functional and multifunctional compound having a vinyl group, an allyl group, an acrylate group, a methacrylate group, and an acrylamide group can be preferably used as a functional group. Specific examples include 2-(2-ethoxyethoxy)ethylacrylate, 1,3-butanediol diacrylate, pentaerythritol triacrylate, ditrimethylolpropane tetraacrylate, cyclohexyl methacrylate, ethyleneglycol dimethacrylate, trimethylolpropane trimethacrylate, trimethylolpropane triacrylate, and glycidyl methacrylate. The ethyleneoxide appendages, propyleneoxide appendages, etc. of these compounds can be preferably used.

An oligomer and a polymer having active carbon-carbon unsaturated double bonds are preferably used as the photosensitive oligomer and the photosensitive polymer. It is preferable that the photosensitive oligomer and polymer have a carboxyl group because the developability of the photosensitive paste coating film after exposure can be improved. The oligomer and polymer having a carboxyl group can be obtained by copolymerizing a monomer including a carboxyl group such as acrylic acid, methacrylic acid, itaconic acid, crotonic acid, maleic acid, fumaric acid, vinyl acetic acid, or their acid anhydrides and a monomer such as methacrylate, acrylate, styrene, acrylonitrile, vinyl acetic, and 2-hydroxyacrylate.

An acryl copolymer having (metha)acrylate and (metha) acrylic acid as a copolymerization component is preferably used as an oligomer and polymer having a carboxyl group because the thermal decomposition temperature at firing is low. Especially, a styrene/methyl methacrylate/methacrylic acid copolymer is preferably used.

The acid value of the copolymer having a carboxyl group is preferably 50 to 150 mgKOH/g. When the acid value exceeds 150, the allowable range of development becomes narrow. Further, when the acid value is less than 50, development cannot be performed unless the concentration of the developer is increased because the solubility of the unexposed part of the photosensitive paste coating film to the developer decreases. When the concentration of the developer is increased, stripping of the exposed part of the photosensitive paste coating film occurs, and a pattern with high accuracy becomes difficult to obtain.

Methods to introduce the active carbon-carbon unsaturated double bonds in a oligomer or a polymer such as a method in which the double bonds are made by letting an ethylenically unsaturated compound having a glycidyl group or an isocyanate group, chloride acrylate, chloride methacrylate, or allylchloride, or carboxylic acid such as maleic acid react to a mercapto group, an amino group, a hydroxide group, or a carboxyl group in the oligomer or the polymer can be used. Examples of the ethylenically unsaturated compound having a glycidyl group include glycidyl acrylate, glycidyl methacrylate, allylglydylether, glycidyl ethylacrylate, crotonylglycidylether, glycidylether crotonate, and glycidylether isocrotonate. Especially, glycidyl methacrylate is preferably used. Examples of the ethylenically unsaturated compound having an isocyanate group include (metha)acryloylisocyanate, and (metha)acryloylethylisocyanate. It is preferable to let the ethylenically unsaturated compound having a glycidyl group or an isocyanate group, and chloride acrylate, chloride methacrylate, or allylchloride of 0.05 to 1 molar equivalent react to a mercapto group, an amino group, a hydroxide group, or a carboxyl group in the oligomer or the polymer.

The preferred added amount of the photosensitive monomer, the photosensitive oligomer, and the photosensitive polymer is 2 to 40% by mass in the photosensitive paste, and more preferably 5 to 30% by mass.

In the case that a binder polymer is necessary, the polymer such as polyvinylalcohol, polyvinylbutyral, a methacrylate copolymer, an acrylate copolymer, an acrylate-methacrylate copolymer, and a butylmethacrylate resin can be used.

A photo-polymerization initiator to be used in the present invention is selected from the compounds generating radical species when they receive an irradiation of active light beam. Further, by using a sensitizer along with the photo-polymerization initiator, the sensitivity can be improved and the wavelength range effective in the reaction can be broadened. A general photo-polymerization initiator and sensitizer can be used as the photo-polymerization initiator and the sensitizer. However, because the photosensitive paste in the present invention includes soft magnetic powder, the photosensitive paste has a black color. Therefore, the exposure light is absorbed, a large amount of exposure is necessary, and sufficient sensitivity is difficult to obtain. Further, resistance of the photosensitive paste coating film to the developer becomes weak after exposure, and there is the case that the photosensitive coating film is stripped from the substrate when the development time becomes long. Accordingly, the photo-polymerization initiator and/or the sensitizer having an absorption index of 1,000 (1/mol·cm) or more at a wavelength of 365 nm can be especially preferably used in the present invention. More preferably, the absorption index is 2,000 (1/mol·cm) or more at a wavelength of 365 nm. Because a high sensitivity can be obtained and the resistance of the photosensitive paste coating film to the developer increases by using the photo-polymerization initiator and/or the sensitizer having an absorption index of 1,000 (1/mol·cm) or more at a wavelength of 365 nm, the process margin can be broadened. The upper limit of the absorption index is not especially limited. However, 100,000 (1/mol·cm) or less at a wavelength of 365 nm is preferable.

The absorption index can be measured as follows.

(1) The photo-polymerization initiator and/or the sensitizer are/is weighed and dissolved completely into γ-butyrolactone.

(2) After weighing, the solution is diluted using a graduated flask of 10 ml.

(3) The absorbance of the diluted solution of (2) at a wavelength range of 265 nm to 600 nm is measured in the wavelength unit of 0.5 nm using UV-3101PC type self-recording spectrophotometer (cell 10 mm) manufactured by Shimadzu Corporation.

(4) When the absorbance obtained in (3) exceeds 0.7, dilution is performed to an appropriate concentration and the absorption spectrum is measured.

(5) The dilution and the measurement are repeated until the maximum absorbance measured becomes 0.7 or less.

(6) The absorption index (1/mol·cm) per unit concentration at 365 nm is calculated using Lambert-Beer's equation from the obtained spectrum of each concentration.

$$\text{Absorption index} = \text{Absorbance}/(\text{Molar concentration} \times d)$$

(d represents a cell length in the equation)

Specific examples of the photo-polymerization initiator in which the absorption index at 365 nm wavelength is 1,000 (1/mol·cm) or more include 2,2-dimethoxy-1,2-diphenylethane-1-on, 2-benzyl-2-dimethylamino-1-(4-morpholinophenyl)-butanone-1, bis(2,4,6-trimethylbenzoyl)-phenylphosphineoixde, and bis(2,6-dimethoxybenzoyl)-2,4,4-trimethyl-pentylphosphineoxide.

In the present invention, one kind or two kinds or more of these can be used. The photo-polymerization initiator is added preferably at the range of 0.05 to 10% by mass to a photosensitive organic component, and more preferably 0.1 to 10% by mass. When the amount of the polymerization initiator is too small, the photo-sensitivity decreases, and when the amount of the polymerization initiator is too large, there is a concern that the residual rate of an exposed part becomes small at development.

Specific examples of the sensitizer in which the absorption index at 365 nm wavelength is 1,000 (1/mol·cm) or more include 2-methylthioxanthone, 2-chlorthioxanthone, 2-isopropylthioxanthone, 2-laurylthioxanthone, 3-chlorthioxanthone, 2,4-dimethylthioxanthone, 2,4-diethylthioxanthone, 2,4-diisopropylthioxanthone, 4,4'-bis(diethylamino)benzophenone, 4,4'-bis(dimethylamino)benzophenone, 4,4'-bis(dipropylamino)benzophenone, 4,4'-bis(piperidine)benzophenone, 2-phenyl-1,2-butadione-2-(o-methoxycarbonyl) oxime, 1-phenylpropanedione-2-(o-ethoxycarbonyl)oxime, and 1,3-diphenylpropanetrione-2-(o-ethoxycarbonyl)oxime. Among these, bis(alkylamino)benzophenone or the thioxanthone derivatives is especially preferable.

In the present invention, one kind or two kinds or more of these can be used. In the case that the sensitizer is added to the photosensitive paste in the present invention, the added amount to the photosensitive organic component is preferably 0.05 to 10% by mass, and more preferably 0.1 to 10% by mass. When the amount of the sensitizer is too small, the effect to improve the photosensitivity is not shown, and when the amount of the sensitizer is too large, there is a concern that the residual rate of the exposure part becomes small at development.

In addition to the photo-polymerization initiator and/or the sensitizer having an absorption index of 1,000 (1/mol·cm) or more at a wavelength of 365 nm, a compound having an absorption maximum in the wavelength range in which the photosensitive organic component exceeds 400 nm is preferably included in the photosensitive paste. By including the photo-polymerization initiator and/or the sensitizer having an absorption index of 1,000 (1/mol·cm) or more at a wavelength of 365 nm as described above, the sensitivity of the photosensitive paste increases. However, in the case that the photosensitive paste coating film is thick, sufficient curing is difficult to achieve because the exposure light is attenuated at the bottom part. Accordingly, in order to achieve curing of the photosensitive paste coating film at the bottom part, a large amount of exposure is necessary. Then, when the compound having an absorption maximum in the wavelength range exceeding 400 nm is included further, curing proceeds also in the bottom part of the coating film because the wavelength of light exceeding 400 nm easily penetrates to the bottom part of the photosensitive paste coating film.

Accordingly, the exposure can be performed at a small amount of exposure. Further, because curing can proceed in the bottom part of the photosensitive paste coating film, the photosensitive paste coating film does not strip from the substrate even if the development time is made long, and the process margin can be broadened. Further, a process with a thick film becomes possible. Especially, it is preferable to use bis(alkylamino)benzophenone or a thioxanthone derivative as a sensitizer combined with a compound having an absorption maximum in the wavelength range exceeding 400 nm because a remarkable effect can be obtained.

It is preferable that the absorption maximum of these compounds exists preferably in the wavelength range exceeding 405 nm and more preferably in the wavelength range exceeding 410 nm because the above-described effect is greater. On the other hand, because the main wavelength of an ultra-high pressure mercury lamp to be used for exposure is normally 365 nm, 405 nm, and 436 nm, in the case of using such a light source, the absorption maximum of these compounds is preferably in the wavelength of 500 nm or less.

Specific examples of a compound having an absorption maximum in the wavelength range exceeding 400 nm include acridone derivatives such as 1-chlor-N-methylacridone, 2-chlor-N-methylacridone, 3-chlor-N-methylacridone, 2-chlor-N-butylacridone, 2-chlor-N-methylacridone, 3-chlor-N-benzylacridone, 4-chlor-N-methylacridone, 2,3-dichlor-N-methylacridone, 2,6-dichlor-N-butylacridone, N-benzylacridone, N-butylacridone, and N-ethylacridone. However, it is not limited to these. The preferred added amount of the compound having an absorption maximum in the wavelength range exceeding 400 nm is 0.1 to 10% by mass in the photosensitive paste. More preferably, it is 0.5 to 5% by mass.

It is effective to add an ultraviolet ray absorber into the photosensitive paste in the present invention. Because the soft magnetic powder and the glass powder, which have a different characteristic as inorganic powder, are used in the photosensitive paste in the present invention, the scattering of the exposure light is large inside the photosensitive paste coating film and there is a tendency that the pattern obtained is easy to be broadened. The ultraviolet ray absorber absorbs the scattered light inside the photosensitive paste coating film and weakens the scattered light. Accordingly, the broadening of the pattern is suppressed, and a sharp pattern can be obtained. Examples of the ultraviolet ray absorber include benzophenone-based compounds, cyanoacrylate-based compounds, salicylic acid-based compounds, benzotriazole-based compounds, indole-based compounds, and inorganic fine particles of metal oxide. Among these, benzophenone-based compounds, cyanoacrylate-based compounds, benzotriazole-based compounds and indole-based compounds are especially effective. Specific examples of these include 2,4-dihydroxybenzophenone, 2-hydroxy-4-methoxybenzophenone, 2,2'-dihydroxy-4-methoxybenzophenone, 2,2'-dihydroxy-4, 4'-di methoxybenzophenone, 2,2'-dihydroxy-4,4'-dimethoxy-5-sulfobenzophenone, 2-hydroxy-4-methoxy-2'-carboxybenzophenone, 2-hydroxy-4-methoxy-5-sulfobenzophenonetrihydrate, 2-hydroxy-4-n-octoxybenzophenone, 2-hydroxy-4-octadecyloxybenzophenone, 2,2',4,4'-tetrahydroxybenzophenone, 4-dodecyloxy-2-hydroxybenzophenone, 2-hydroxy-4-(2-hydroxy-3-methacryloxy)propoxybenzophenone, 2-(2'-hydroxy-5'-methylphenyl)benzotriazole, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-4'-n-octoxyphenyl)benzotriazole, 2-ethylhexyl-2-cyano-3,3-diphenylacrylate, 2-ethyl-2-cyano-3,3-diphenylacrylate, BONASORB UA-3901 (manufactured by Orient Chemical Ltd.), BONASORB UA-3902 (manufactured by Orient Chemical Ltd.), and SOM-2-0008 (manufactured by Orient Chemical Ltd.), which are indole-based absorbers. However, it is not limited to these. Furthermore, a reactive ultraviolet ray absorber in which a methacryl group, etc. is introduced to the skeleton of these ultraviolet ray absorbers can be preferably used. In the present invention, one kind or more of these can be used.

The added amount of the ultraviolet ray absorber is preferably 0.001 to 10% by mass in the photosensitive paste, and more preferably 0.005 to 5% by mass. When the added amount is less than 0.001 by mass, the ability to absorb the scattered light is low. The added amount exceeding 10% by mass is not preferable because the transmittance of the exposing light decreases and the sensitivity of the photosensitive paste decreases.

It is effective to use an organic dye as the ultraviolet ray absorber. In the case of using an organic dye, there is an effect that the visibility at development becomes good by the photosensitive paste being colored in addition to the effect of absorbing the scattered light inside the above-described photosensitive paste. That is, the part in which the paste is remaining at development is easily distinguished from the part in which the paste was removed. The organic dye is not especially limited. However, an organic dye which does not remain in the insulating film after firing is preferable. Specifically, an anthraquinone-based dye, an indigoide-based dye, a phthalocyanine-based dye, a carbonium-based dye, a quinoneimine-based dye, a methine-based dye, a quinoline-based dye, a nitro-based dye, a nitroso-based dye, a benzoquinone-based dye, naphthoquinone-based dye, a phthalimide-based dye, a perynone-based dye, etc. can be used. Especially, it is preferable to select an organic dye which absorbs the wavelength of light around an h-line and an i-line, for example a carbonium-based dye such as Basic Blue, because the effect of the present invention can be exhibited more. The added amount of the organic dye is preferably 0.001 to 1% by mass.

Furthermore, it is effective to add a polymerization inhibitor into the photosensitive paste in the present invention. By adding the polymerization inhibitor, the polymerization inhibitor captures a radical when the amount of exposure is small. Because a photo-reaction proceeds rapidly from the point where the amount of exposure increases to the stage where the reaction cannot be suppressed by the polymerization inhibitor, the contrast of soluble and insoluble components of the photosensitive paste in the developer after exposure can be increased.

Specific examples of the polymerization inhibitor include hydroquinone, phenothiazine, p-t-butylcatechol, 2,5-dibutyl-hydroquinone, mono-t-butylhydroquinone, 2,5-di-t-amylhydroquinone, N-phenylnaphthylamine, 2,6-di-t-butyl-p-methylphenol, chloranil, p-methoxyphenol, and pyrogallol. However, it is not limited to these. In the present invention, one kind or more of these can be used.

The added amount of the polymerization inhibitor is preferably 0.001 to 1% by mass in the photosensitive paste, and more preferably 0.005 to 0.5% by mass. In the case that it is smaller than these ranges, the improving effect of the contrast of soluble and insoluble components in the developer is small. Further, it is not preferable to exceed this range because the sensitivity of the photosensitive paste decreases and the degree of polymerization of the photosensitive organic component does not increase.

By controlling the ultraviolet ray absorber and polymerization inhibitor, controlling of the pattern shape becomes possible.

The organic solvent is preferably added in order to adjust the viscosity according to the method of coating when the photosensitive paste is applied onto the substrate. Methylethylketone, dioxane, acetone, cyclohexanone, cyclopentanone, isobutyl alcohol, isopropyl alcohol, tetrahydrofuran, dimethylsulfoxide, γ-butyrolactone, bromobenzene, chlorobenzene, dibromobenzene, dichlorobenzene, bromobenzoic acid, chlorobenzoic acid, etc., diethyleneglycolmonoethyletheracetate, diethyleneglycolmonobutylether, diethyleneglycolmonobutyletheracetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropyleneglycolmonoethylether, tripropyleneglycolmonomethylether, propyleneglycolmonomethyletheracetate, and organic solvent mixtures including one kind or more of these are preferably used. It is preferable to select an organic solvent considering mainly volatility and solubility of the photosensitive monomer, the photosensitive oligomer, and the photosensitive polymer to be used. When the solubility of the photosensitive monomer, the photosensitive oligomer, and the photosensitive polymer to the organic solvent is low, the viscosity of the photosensitive paste becomes high even though the solid ratio is identical, and there is a tendency that the coating characteristic deteriorates.

When the content of the organic solvent is too small, the viscosity of the photosensitive paste becomes too high, air bubbles in the coating film become difficult to be removed, and there is a tendency that smoothness of the coating face becomes bad. On the contrary, in the case that the content ratio of the organic solvent is too large, precipitation of the inorganic powder in the photosensitive paste becomes fast, the composition of the photosensitive paste becomes unstable, and energy and time required for drying becomes large. The preferred content ratio of the organic solvent is 5 to 50% by mass in the photosensitive paste, more preferably 10 to 40% by mass.

The photosensitive paste in the present invention is manufactured by preparing each component into a predetermined composition, preliminarily dispersing with a mixer such as a planetary mixer, and dispersing uniformly with a dispersing and kneading means using a dispersion machine such as three rollers.

The photosensitive paste in the present invention can be preferably used in the manufacture of a member for a display panel. In the present invention, the member for a display panel means a member for a display panel having an electromagnetic shielding property. Typical examples include an electromagnetic shielding material placed in the front face of a display panel, and an optical filter for a display panel including the electromagnetic shielding material.

Further, the photosensitive paste in the present invention can be used in an electromagnetic shield of a radio communication device, a magnetic layer of a circuit board having an inductor part, etc., besides the member of a display panel. In the case of using it in the magnetic layer of the circuit board, for example, the magnetic layer is formed by applying the photosensitive paste in the present invention onto the substrate and drying, forming a through-hole part after going through an exposure step and a development step, and then firing. By using the photosensitive paste in the present invention, there are advantages that productivity becomes high and cost can be reduced and that stripping of the magnetic layer at the inductor part becomes difficult to occur and reliability improves.

Next, a manufacturing method of a member for a display panel using the photosensitive paste in the present invention is explained using an electromagnetic shielding material as an example.

Examples of the layer configuration of the electromagnetic shielding material include configurations such as substrate/black layer/metal layer, substrate/metal layer/black layer, and substrate/black layer/metal layer/black layer. It is preferable to configure the substrate as substrate/transparent conductive layer/black layer/metal layer, substrate/transparent conductive layer/metal layer/black layer, and substrate/transparent conductive layer/black layer/metal layer/black layer, etc. using a substrate in which a transparent conductive layer is formed on the surface. In the case using a pasting method in the formation of the black layer and the metal layer, by changing the type and order of the paste to be applied, any layer configuration can be formed.

(Substrate)

Any substrate to be used for the electromagnetic shielding material can be used without a special limitation as long as it is a transparent substrate which can be placed in the front face of a display. Specific examples which can be used include a glass substrate, a resin substrate, and a film. A known transparent resin substrate such as an acrylic material and a polycarbonate substrate of 0.5 to 3 mm thickness can be used as the resin substrate. Further, a polyethylene terephthalate film and a polycarbonate film can be used as the film.

Among these, using a glass substrate is the most preferable in the respects of cost and a high degree of freedom in processing. The thickness of the glass substrate is preferably about 0.7 to 5 mm, and more preferably in the range of about 1.0 to 3.5 mm. When the thickness is thinner than 0.7 mm, the glass substrate is easily broken at handling and in usage. It is not preferable that the thickness exceeds 5 mm because it becomes too heavy. Further, from the viewpoint of preventing breakage at manufacturing and at using, the glass substrate is preferably subjected to a tempering treatment. From the viewpoint of the tempering treatment, a glass substrate having 1.5 mm thickness or more is preferable.

The tempering treatment of the glass substrate may be performed before or after the formation of the black layer and the metal layer. That is, the black layer and the metal layer may be formed on the tempered glass after the tempering treatment is performed on the glass substrate, or the tempering treatment may be performed on the glass after the black layer and the metal layer are formed on normal glass. The tempering treatment of glass is a treatment to increase the strength of the glass by making the surface of the glass have a compression strain. The tempering treatment is classified into a thermal tempering treatment and a chemical tempering treatment depending on the method of making the surface have a compression strain. Because glass gets broken at the surface by a tensile force, the strength can be increased by making the surface have a compression strain in advance. The thermal tempering treatment is performed by heating a plate-shaped glass to around its softening point, rapidly cooling the surface of the glass with an air jet, and forming a compressive stress layer on the surface of the glass. In the case of performing the tempering treatment after the formation of the black layer and the metal layer, the tempering treatment is preferably performed by heating the glass substrate to around the softening point in a heating furnace having a heating chamber which can heat continuously or by stages and rapidly cooling by blowing an air jet perpendicular to the both faces of the glass substrate from a group of air nozzles.

The glass substrate may be colored with a metal ion, a metal colloid, a nonmetal element, etc. The coloring of the glass substrate can be performed with a known method. The coloring in many cases is performed to improve the ease of watching.

(Transparent Conductive Layer)

By forming a transparent conductive layer on the surface of the substrate, the resistance value of the substrate is decreased and the electromagnetic shielding property can be improved while maintaining the light transmittance. For example, by using a glass substrate in which a transparent conductive layer comprising ITO or tin oxide is formed on the surface of the glass substrate, the electromagnetic shielding property can be improved. These transparent conductive layers can be formed on the substrate with a sputtering or a CVD (chemical vapor deposition) method.

ITO used as the transparent conductive layer has an advantage that a low resistance can be obtained compared to tin oxide. However, in the case of using a glass as the substrate, tin oxide in which expensive indium is not used is superior in the respect of cost. Further, in the case of using silver as the metal layer, tin oxide is also preferable in that it has an advantage that the problem of yellowing by a reaction between silver and glass when silver is formed on the glass substrate can be suppressed.

(Metal Layer)

In order to obtain a sufficient electromagnetic shielding property, the surface resistance value of the electromagnetic shielding material is preferably 1 $\Omega \cdot cm$ or less. More preferably, the surface resistance value is 0.1 $\Omega \cdot cm$ or less. However, it is difficult to make the surface resistance value of the electromagnetic shielding material 1 $\Omega \cdot cm$ or less only with the transparent conductive layer. Further, in the case of forming a thick transparent conductive layer in order to decrease the resistance value, there are problems that the transmittance of the light beam decreases and visibility of the display decreases, and that a vacuum step for a long period of time becomes necessary and productivity decreases remarkably. Accordingly, it is preferable to form a meshed or striped metal layer on the substrate. By forming the metal layer meshed or striped, light can transmit from the open parts of the stripes or the mesh.

Silver in which the resistance value can be easily decreased is preferably used as a material of the metal layer. The metal layer may include a metal such as nickel and aluminum besides silver. However, it is preferable to make the content of silver in the metal component 50% by mass or more in order to decrease the resistance value. When the content of silver becomes less than 50%, the resistance value becomes easy to increase.

Further, in order to obtain a sufficient electromagnetic shielding property, it is desirable to make line width of a meshed or striped metal layer to be 5 to 30 $\mu m$. When the line width of the mesh or stripe is smaller than 5 $\mu m$, a loss of the pattern can easily occur, and when the line width exceeds 30 $\mu m$, the light transmittance decreases. Further, the thickness of the metal layer is preferably 0.5 to 15 $\mu m$, and more preferably 1 to 10 $\mu m$. When it is thinner than 0.5 $\mu m$, the resistance value of the metal layer becomes large and the electromagnetic shielding property becomes insufficient. On the other hand, when the thickness of the metal layer becomes thicker than 15 $\mu m$, the step of forming the mesh or the stripe becomes complicated and the material cost increases. Further, when the metal layer is thick, there is a decrease of the visibility due to the reflection at the side face of the pattern, and there is a problem that a step of transparency treatment to prevent it becomes necessary.

Further, the pitch of the meshed or striped pattern is preferably ½ or less of the pixel pitch of PDP because there is the case that the visibility of a display decreases due to the moire phenomenon when it becomes coarse. That is, because an image element of 0.7 to 1 mm square is formed in a normal PDP, it is preferable to form the pitch of the mesh or the stripe at 0.1 to 0.5 mm pitch.

(Black Layer)

Because the metal layer reflects light, there is a problem that the visibility of a display decreases due to the reflected light. Accordingly, it is preferable to improve the visibility by forming a black layer and suppressing the reflection. By forming a black layer having a striped or meshed shape the same as the metal layer on the upper part of the metal layer, that is, by forming an upper black layer, the reflection can be suppressed and the visibility of a display and the electromagnetic shielding property can be reconciled.

The thickness of the black layer also influences the blackness of the black layer. However, it is preferably 0.5 to 10 μm. In order to obtain sufficient blackness, the thickness of the black layer is preferably 0.5 μm or more. Further, in the respect of cost of materials, the thickness of the black layer is preferably 10 μm or less.

It is preferable to form the black layer using the photosensitive soft magnetic paste in the present invention because the black layer itself has an electromagnetic shielding property and because the electromagnetic shielding material with a high electromagnetic shielding property can be formed.

(Manufacturing Method)

An example of the method of manufacturing the metal layer on the substrate is a method of forming the metal layer by forming a necessary pattern on the substrate using a paste including a metal and then firing. A pattern printing method such as offset printing and screen printing may be used as a method of forming the necessary pattern using the metal paste. However, it is difficult to make the metal layer thick in the offset printing, and on the other hand, there is a problem that it is difficult to make the line width of the metal layer as thin as 30 μm or less in the screen printing. Accordingly, the preferred method is a photosensitive paste method. The photosensitive paste method is a method of forming a pattern with a photolithography method using a paste including a photosensitive organic component and metal powder.

Further, the preferred example of the method of manufacturing the black layer is a method of forming the black layer by forming a necessary pattern with a photolithography method using the photosensitive soft magnetic paste in the present invention and then firing. Moreover, the firing of the metal layer and the black layer may be performed together.

An example of the manufacturing method of the electromagnetic shielding material using the photosensitive paste method is shown below. A photosensitive metal paste including metal powder and a photosensitive organic component is applied on a substrate, dried, and a photosensitive metal paste coating film is formed. Furthermore, the photosensitive soft magnetic paste in the present invention is applied on top of it and dried, and a layered coating film of the photosensitive metal paste coating film and the photosensitive soft magnetic paste coating film is formed. Next, by exposing the layered coating film by irradiating active light beam through a photo mask corresponding to the meshed pattern and then developing, the layered coating film is formed as a meshed pattern. Continuously, in the case of using a glass substrate as a substrate, it is fired by being heated to 400 to 700° C. Accordingly, the organic component in the layered coating film is burned away, the inorganic powder is adhered, the metal layer is formed from the metal paste coating film, and the black layer is formed from the soft magnetic paste coating film. In the case that the firing temperature is less than 400° C., the adhesion with the glass substrate becomes insufficient because the organic substances in the metal layer and the black layer do not decrease sufficiently. On the other hand, when the firing temperature exceeds 700° C., there is a concern that deformation of the glass substrate itself may occur.

In order to adhere the inorganic powder sufficiently, the residual amount of the organic substance in the metal layer and the black layer is preferably made to be 10% or less of the mass before firing and further preferably made to be 5% or less. The firing time may be adjusted so that the residual organic substance decreases to the preferred range within the preferred temperature range. Further, in the case of using a tempering treated glass as the glass substrate, the firing condition is necessarily set lower than the distortion point of the glass so that the tempering is not weakened. Therefore it is preferable to perform the firing at a temperature 30° C. or more lower than the distortion point of the glass, further preferably 50° C. or more lower than the distortion point of the glass, and especially preferable to perform the firing at 100° C. or more lower temperature. On the other hand, in the case of using a normal glass as a glass substrate, the tempering of the glass can be performed at the same time by forming a pattern of the photosensitive paste coating film on the glass substrate, firing at a temperature near the softening point of the glass substrate, and then cooling rapidly. Specifically, for example, the firing of the photosensitive paste coating film and the tempering treatment of the glass substrate can be performed at the same time by heating at 600 to 700° C. for about a few tens of seconds to more than a dozen minutes, and then cooling rapidly. The condition of the tempering treatment is determined properly depending on the thickness of the glass substrate and the degree of the necessary tempering.

In such manner, the electromagnetic shielding material in which the meshed metal layer and black layer are formed on the glass substrate is obtained. By further adding a function of preventing reflection and a function of controlling transmittance to the electromagnetic shielding material, an optical filter for a display is prepared. There is a method of applying reflection preventive paints with low refractive index on the processed substrate and heating as a method of adding the function of preventing reflection. Further, there is also a method of attaching a film having the function of preventing reflection onto the electromagnetic shielding material. Further, in the case of using the electromagnetic shielding material in a color correction film to control the wavelength of the transmitting light, a film that cuts infrared rays and ultraviolet rays, or a plasma display, an optical filter having the function of controlling transmittance can be prepared by adhering a film having a function of cutting a neon light etc. It is possible to add near-infrared absorption performance by adding an appropriate metal ion into the glass substrate itself. Furthermore, it is also preferable to adhere an anti-fouling film which prevents a contaminant such as finger prints from adhering on the surface. Further, the optical filter obtained in such a manner can be preferably used as a front face filter for a display such as a front face filter for a plasma display panel, etc.

EXAMPLES

The present invention is explained in detail with examples below. However, the present invention is not limited to these examples. Moreover, the electromagnetic shielding material obtained in each example and comparative examples was evaluated by (1), (2), and (3) below.

(1) Line Width and Shape of the Metal Layer and the Black Layer

The metal layer and the black layer formed in mesh shape in the electromagnetic shielding material obtained in each example was observed, and measurement of the line width and observation of the shape were performed.

(2) Resistance Value

The surface resistance of the electromagnetic shielding material obtained in each example was measured with a 4-pin probe method using a surface resistance tester "Loresta" manufactured by Mitsubishi Chemical Corporation.

(3) Electromagnetic Shielding Property

A sample of 100 mm square was cut from the electromagnetic shielding material obtained in each example and the electromagnetic shielding property was measured using an EMI shielding measurement apparatus (MA8602B) manufactured by Anritsu Corporation based upon the KEC (Kansai Electric Industry Development Center) method.

10 dB or less: almost no effect
10 to 30 dB: minimum effect
30 to 60 dB: average effect
60 to 80 dB: average or more effect
80 to 120 dB: high performing effect (Shielding performance: dB)=20×log (strength of electric field after shielding/strength of electric field before shielding)

(4) Absorption Index

The absorption index of the photo-polymerization initiator and the sensitizer used in the photosensitive paste was obtained with the following steps.

a. A photo-polymerization initiator and/or a sensitizer are weighed and dissolved completely into γ-butyrolactone.

b. After weighing, it is diluted using a graduated flask of 10 ml.

c. Absorbance of the diluted solution of b in the range of 265 nm to 600 nm wavelength is measured in increments of 0.5 nm wavelength using a UV-3101PC type self-recording spectrophotometer (cell 10 mm) manufactured by Shimadzu Corporation.

d. when the absorbance obtained in c exceeds 0.7, dilution is performed to an appropriate concentration and an absorption spectrum is measured.

e. The dilution and the measurement are repeated until the maximum absorbance measured becomes 0.7 or less.

f. The absorption index (1/mol·cm) per unit concentration at 365 nm is calculated using Lambert-Beer's equation from the obtained spectrum of each concentration.

Absorption index=Absorbance/(molar concentration×$d$)

($d$ in the equation indicates a cell length)

(5) Particle Diameter of the Inorganic Powder

The particle diameter of the inorganic powder used in the photosensitive paste was measured using a grain size distribution meter HRA9320-X100 manufactured by Microtrac Corporation by dispersing the sample 1 g ultrasonically for 1.5 minute in distilled water. The particle refractive index was changed depending on the type of the inorganic powder, and the solvent refractive index was set at 1.33. The measurement was performed three times and the average value was obtained.

Examples 1 to 12

A photosensitive silver paste comprising glass powder 3% by mass, methylmethacrylate/methacryl acid copolymer (mass composition ratio 60/40, mass average molecular weight 32000) 6% by mass, dipentaerythritol hexaacrylate 3% by mass, 1-hydroxycyclohexyl phenylketone 1% by mass, Ag powder of 2 μm average particle diameter (manufactured by Dowa Mining Co., Ltd.) 74% by mass, and an organic solvent (diethyleneglycol monobutyletheracetate) 13% by mass was applied on all the surface of a soda glass substrate of 970 mm×580 mm size and 3 mm thickness (manufactured by Nippon Sheet Glass Co., Ltd.) using a screen printer and a screen board of 380 mesh manufactured by Micro-tec Co., Ltd., and was dried at 100° C. for 30 minutes using a hot air dryer manufactured by TABAI MFG. Co., Ltd. A glass powder having average particle diameter 0.8 μm and maximum particle diameter 7 μm was used as the glass powder which was made by crushing a glass consisting of bismuth oxide (75% by mass), silicon oxide (5% by mass), boron oxide (10% by mass), zirconium oxide (3% by mass), zinc oxide (3% by mass), and aluminum oxide (4% by mass) into powder. The thickness of the photosensitive silver paste coating film after drying was 15 μm.

Next, the photosensitive soft magnetic paste of the composition shown in Table 1 was applied on all the surface of the photosensitive silver paste coating film using a screen printer and a screen plate of 380 mesh manufactured by Micro-tec Co., Ltd., and was dried at 100° C. for 30 minutes using a hot air dryer manufactured by TABAI MFG. Co., Ltd. The thickness of the photosensitive soft magnetic paste coating film after drying was 13 μm. The irradiation of an exposition light was performed on the substrate obtained in such manner through a photo mask in which openings were formed in a meshed shape of 300 μm line space and 20 μm line width, and the photosensitive silver paste coating film and the photosensitive soft magnetic paste coating film were exposed at the same time. An exposure machine (light source: 2 kW ultra-high pressure mercury lamp) manufactured by Dainippon Screen Mfg. Co, Ltd. was used as the exposure machine. After the exposure, the photosensitive silver paste coating film and the photosensitive soft magnetic paste coating film was processed into a meshed pattern by developing with a shower for two minutes using 2-aminoethanol solution of 0.5%. Then, after the glass substrate with this meshed pattern was fired at 700° C. for 5 minutes using a roller hearth firing furnace manufactured by Koyo Thermotech, it was rapidly cooled by blowing air. With this treatment, the photosensitive silver paste coating film and the photosensitive soft magnetic paste coating film became the metal layer and the black layer having a meshed pattern and adhered firmly to the glass substrate, and the substrate glass became a tempered glass. In such a manner, the electromagnetic shielding material was manufactured.

Moreover, materials used in Table 1 are as follows. In Table 1, the upper part is the material and the lower part is its ratio (parts by mass).

TABLE 1

| Photosensitive paste No. | Soft magnetic powder | Glass powder | Black pigment | Polymer | Monomer | Photo-polymerization initiator | Sensitizer | compound having absorption maximum at more than 400 nm | Ultraviolet ray absorber | Polymerization inhibitor | Organic solvent |
|---|---|---|---|---|---|---|---|---|---|---|---|
| 1 | A | C | — | E | F | G | — | — | M | N | O |
|   | 30 | 30 |   | 10 | 7 | 3 |   |   | 0.02 | 0.05 | 20 |
| 2 | A | C | — | E | F | G | — | — | M | N | O |
|   | 40 | 20 |   | 10 | 7 | 3 |   |   | 0.02 | 0.05 | 20 |
| 3 | A | C | — | E | F | G | — | — | M | N | O |
|   | 15 | 45 |   | 10 | 7 | 3 |   |   | 0.02 | 0.05 | 20 |

TABLE 1-continued

| Photosensitive paste No. | Soft magnetic powder | Glass powder | Black pigment | Polymer | Monomer | Photo-polymeri-zation initiator | Sensi-tizer | compound having absorption maximum at more than 400 nm | Ultraviolet ray absorber | Polymeri-zation inhibitor | Organic solvent |
|---|---|---|---|---|---|---|---|---|---|---|---|
| 4  | B    | C  | —   | E  | F | G   | —   | —   | M    | N    | O  |
|    | 30   | 30 |     | 10 | 7 | 3   |     |     | 0.02 | 0.05 | 20 |
| 5  | B    | C  | D   | E  | F | G   | —   | —   | M    | N    | O  |
|    | 29.5 | 30 | 0.5 | 10 | 7 | 3   |     |     | 0.02 | 0.05 | 20 |
| 6  | A    | C  | —   | E  | F | H   | J   | —   | M    | N    | O  |
|    | 30   | 30 |     | 10 | 7 | 2   | 1   |     | 0.02 | 0.05 | 20 |
| 7  | A    | C  | —   | E  | F | —   | J   | L   | M    | N    | O  |
|    | 30   | 30 |     | 10 | 7 |     | 1.5 | 1.5 | 0.02 | 0.05 | 20 |
| 8  | A    | C  | —   | E  | F | —   | K   | L   | M    | N    | O  |
|    | 30   | 30 |     | 10 | 7 |     | 1.5 | 1.5 | 0.02 | 0.05 | 20 |
| 9  | A    | C  | —   | E  | F | H   | —   | L   | M    | N    | O  |
|    | 30   | 30 |     | 10 | 7 | 2   |     | 1   | 0.02 | 0.05 | 20 |
| 10 | A    | C  | —   | E  | F | I   | —   | —   | M    | N    | O  |
|    | 30   | 30 |     | 10 | 7 | 3   |     |     | 0.02 | 0.05 | 20 |
| 11 | A    | C  | —   | E  | F | G   | —   | —   | —    | N    | O  |
|    | 30   | 30 |     | 10 | 7 | 3   |     |     |      | 0.05 | 20 |
| 12 | A    | C  | —   | E  | F | G   | —   | —   | M    | —    | O  |
|    | 30   | 30 |     | 10 | 7 | 3   |     |     | 0.02 |      | 20 |
| 13 | A    | C  | —   | E  | F | G   | —   | —   | —    | —    | O  |
|    | 30   | 30 |     | 10 | 7 | 3   |     |     |      |      | 20 |
| 14 | A    | C  | —   | E  | F | G   | —   | —   | M    | N    | O  |
|    | 45   | 15 |     | 10 | 7 | 3   |     |     | 0.02 | 0.05 | 20 |
| 15 | A    | C  | —   | E  | F | G   | —   | —   | M    | N    | O  |
|    | 10   | 50 |     | 10 | 7 | 3   |     |     | 0.02 | 0.05 | 20 |

A: Mn—Zn based ferrite powder, trade name "KNS-415" (manufactured by Toda Kogyo Corporation), average particle diameter 1.7 μm, maximum particle diameter 7.3 μm.
B: Ni—Zn based ferrite powder, trade name "BSN-714" (manufactured by Toda Kogyo Corporation), average particle diameter 2.7 μm, maximum particle diameter 8.1 μm.
C: Noncrystalline glass powder of average particle diameter 0.8 μm and maximum particle diameter 7 μm in which a glass consisting of bismuth oxide (75% by mass), silicon oxide (5% by mass), boron oxide (10% by mass), zirconium oxide (3% by mass), zinc oxide (3% by mass), and aluminum oxide (4% by mass) are crushed into powder.
D: Cobalt oxide ($Co_3O_4$, average particle diameter 0.1 μm).
E: Photosensitive acrylic polymer having acid value of 85 and mass average molecular weight of 32,000 (APX-716 manufactured by Toray Industries, Inc.)
F: Propylene oxide-modified trimethylolpropane triacrylate (manufactured by Dai-ichi Kogyo Seiyaku Co., Ltd.)
G: 2-benzyl-2-dimethylamino-1-(4-morpholinophenyl)-butanone-1 (molecular absorption index at 365 nm wavelength: 7,800).
H: bis(2,4,6-trimethylbenzoyl)-phenylphosphineoxide (molecular absorption index at 365 nm wavelength: 2,300).
I: 1-hydroxycyclohexyl phenylketone (molecular absorption index at 365 nm wavelength: 20).
J: 2,4-diethylthioxanthone (molecular absorption index at 365 nm wavelength: 5,100).
K: 4,4'-bis(diethylamino)benzophenone (molecular absorption index at 365 nm wavelength: 37,000).
L: N-butylacridone (maximum absorption wavelength 402 nm)
M: Basic Blue 26
N: p-methoxyphenol
O: Diethyleneglycolmonobutyletheracetate The result in which the photosensitive paste of composition in Table 1 was used is shown in Table 2. In Examples 1 to 9, the exposure was performed with sensitivity capable enough for practical use, and the line width and the shape of the metal layer and the black layer were good. In Example 10, a large amount of exposure was necessary and the shape of the metal layer and the black layer was slightly bad. However, the pattern formation was possible. In Examples 11 to 13, the shape of the metal layer and the black layer was slightly bad. However, the pattern formation was possible.

Next, the evaluation result of the obtained electromagnetic shielding material is shown in Table 2.

TABLE 2

| | Photosensitive paste No. | Amount of exposure (mj/cm$^2$) | Line width (μm) | Shape | Visibility | Electromagnetic shielding property (db) | | |
|---|---|---|---|---|---|---|---|---|
| | | | | | | 30 MHz | 100 MHz | 300 MHz |
| Example 1  | 1  | 300  | 21 | Rectangle | Good | 44 | 40 | 31 |
| Example 2  | 2  | 400  | 19 | Rectangle | Good | 54 | 47 | 38 |
| Example 3  | 3  | 200  | 22 | Rectangle | Good | 40 | 36 | 28 |
| Example 4  | 4  | 300  | 22 | Rectangle | Good | 58 | 51 | 39 |
| Example 5  | 5  | 350  | 20 | Rectangle | Good | 63 | 57 | 43 |
| Example 6  | 6  | 700  | 21 | Rectangle | Good | 45 | 40 | 30 |
| Example 7  | 7  | 100  | 20 | Rectangle | Good | 46 | 42 | 30 |
| Example 8  | 8  | 200  | 22 | Rectangle | Good | 45 | 40 | 31 |
| Example 9  | 9  | 200  | 22 | Rectangle | Good | 44 | 40 | 31 |
| Example 10 | 10 | 3500 | 16 | Tapered towards the bottom | Good | 41 | 37 | 28 |
| Example 11 | 11 | 100  | 33 | Trapezoid | Good | 51 | 44 | 33 |
| Example 12 | 12 | 200  | 34 | Trapezoid | Good | 50 | 44 | 32 |
| Example 13 | 13 | 50   | 56 | Trapezoid | Good | 53 | 46 | 36 |

TABLE 2-continued

| | Photosensitive paste No. | Amount of exposure (mj/cm²) | Line width (µm) | Shape | Visibility | Electromagnetic shielding property (db) | | |
|---|---|---|---|---|---|---|---|---|
| | | | | | | 30 MHz | 100 MHz | 300 MHz |
| Comparative example 1 | — | — | 20 | — | Good | 33 | 29 | 23 |
| Comparative example 2 | — | — | 20 | — | Bad | 59 | 48 | 39 |
| Comparative example 3 | 14 | 300 | — | — | — | — | — | — |
| Comparative example 4 | 15 | 200 | 23 | Rectangle | Bad | 31 | 27 | 19 |

Moreover, a front face filter was manufactured by attaching a functional film having a function of preventing reflection, a function of correcting color, and a function of cutting neon (manufactured by Sumitomo Osaka Cement Co., Ltd.) on the electromagnetic shielding material manufactured in Examples 1 to 12. Visibility was evaluated with respect to haze of the display and it was good.

Comparative Example 1

A meshed pattern of 300 µm pitch and 20 µm line width was formed on a polyester film of 970 mm×580 mm in size using a silver paste including 1% by mass of carbon black with an intaglio offset printing method, and was heated to 150° C. Continuously, a copper plated layer was formed to have 3 µm on a meshed silver paste pattern with electrolysis plating. In such a manner, an electromagnetic shielding film having a meshed pattern on a polyester film was prepared.

A front face filter was prepared by attaching the obtained electromagnetic shielding material on the glass substrate and adhering a functional film having a function of preventing reflection, a function of correcting color, and a function of cutting neon (manufactured by Sumitomo Osaka Cement Co., Ltd.) on top of it. When visibility was evaluated with respect to haze of the display, it was good. However, an extra step was necessary because the plating step is required.

Comparative Example 2

After laminating a copper foil of 13 µm thickness on a polyester film of 970 mm×580 mm in size, a dry film resist was laminated. The dry film resist was exposed through a photo mask in which openings were formed in a meshed shape of 300 µm line space and 20 µm line width. Continuously, through respective steps of development, etching, and resist stripping, an electromagnetic shielding film having a meshed pattern on a polyester film was prepared.

A front face filter was prepared by attaching the obtained electromagnetic shielding material on the glass substrate and adhering a functional film having a function of preventing reflection, a function of correcting color, and a function of cutting neon (manufactured by Sumitomo Osaka Cement Co., Ltd.) on top of it. When the visibility was evaluated from haze of the display, the haze was strong and the visibility was bad.

Comparative Example 3

An electromagnetic shielding material was prepared in the same manner as Example 1 except the composition of the photosensitive soft magnetic paste was changed as shown in Table 1. After firing, the metal layer and the black layer were stripped from the glass substrate.

Comparative Example 4

An electromagnetic shielding material and a front face filter were prepared in the same manner as Example 1 except the composition of the photosensitive soft magnetic paste was changed as shown in Table 1. When the visibility was evaluated with respect to haze of the display, the haze was strong and the visibility was bad.

Possibility of Use in Industry

A photosensitive paste can be provided in which an electromagnetic shielding material with superior visibility can be manufactured with a simple step by using the photosensitive paste in the present invention.

Further, the photosensitive paste in the present invention can be used in an electromagnetic shield of a radio communication device, a magnetic layer of a circuit board having an inductor part, etc., besides the electromagnetic shielding material of a display panel.

There are advantages that productivity becomes high and cost can be reduced, that the soft magnetic layer formed becomes difficult to strip from the substrate and the reliability is improved, etc. using the photosensitive paste in the present invention.

The invention claimed is:

1. A photosensitive paste comprising an inorganic powder and a photosensitive organic component, wherein the inorganic powder includes at least a soft magnetic powder (A) and a glass powder (B), and wherein the mass ratio of the soft magnetic powder (A) to the glass powder (B) is in the range of 20/80 to 70/30.

2. The photosensitive paste as in claim 1, wherein the soft magnetic powder comprises a ferrite powder.

3. The photosensitive paste as in claim 2, wherein the ferrite powder comprises a ferrite represented with the formula of $MFe_2O_4$, wherein M is a divalent metal selected from Mn—Zn, Ni—Zn, Cu—Zn, Mg—Zn, and Ni—Cu—Zn.

4. The photosensitive paste as in claim 1, wherein the average particle diameter of the soft magnetic powder is in the range of 0.1 to 5 µm, and the maximum particle diameter of the soft magnetic powder is 10 µm or less.

5. The photosensitive paste, as in claim 1, wherein the glass powder is noncrystalline glass.

6. The photosensitive paste as in claim 1, wherein the glass powder includes glass including at least one kind selected from bismuth oxide, zinc oxide, lead oxide, and phosphorus oxide.

7. The photosensitive paste as in claim 1, wherein the average particle diameter of the glass powder is in the range of 0.1 to 5 μm, and the maximum particle diameter of the glass powder is 10 μm or less.

8. The photosensitive paste as in claim 1, wherein the photosensitive organic component includes a photo-polymerization initiator and/or a sensitizer whose molecular absorption index is 1,000 (1/mol·cm) or more at 365 nm wavelength.

9. The photosensitive paste as in claim 8, wherein the photosensitive organic component further includes a compound having an absorption maximum in the wavelength range exceeding 400 nm.

10. The photosensitive paste as in claim 9, wherein the photosensitive organic component includes a compound having an absorption maximum in the wavelength range exceeding 400 nm, and includes bis(alkylamino)benzophenone or thioxanthone derivatives.

11. The photosensitive paste as in claim 1, wherein the photosensitive organic component includes an ultraviolet ray absorber.

12. The photosensitive paste as in claim 1, wherein the photosensitive organic component includes a polymerization inhibitor.

13. A manufacturing method of a member for a display panel including the steps of applying the photosensitive paste as in claim 1 on a substrate and drying.

14. A photosensitive paste comprising an inorganic powder and a photosensitive organic component, wherein the inorganic powder includes at least a soft magnetic powder (A) and a glass powder (B), and wherein the mass ratio of the soft magnetic powder (A) to the glass powder (B) is in the range of 30/70 to 70/30.

15. The photosensitive paste as in claim 1, wherein the soft magnetic powder comprises a powder of iron alloys.

* * * * *